(12) United States Patent
Jakes et al.

(10) Patent No.: US 8,345,891 B2
(45) Date of Patent: Jan. 1, 2013

(54) INTELLIGENT SELECTIVE SYSTEM MUTE

(75) Inventors: Philip John Jakes, Durham, NC (US);
John Weldon Nicholson, Holly Springs, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 749 days.

(21) Appl. No.: 12/578,865

(22) Filed: Oct. 14, 2009

(65) Prior Publication Data
US 2011/0085679 A1 Apr. 14, 2011

(51) Int. Cl.
*H04B 15/00* (2006.01)
(52) U.S. Cl. .......................................... 381/94.5; 700/94
(58) Field of Classification Search .................. 381/94.5, 381/77–81, 85, 107; 700/94
See application file for complete search history.

(56) References Cited

U.S. PATENT DOCUMENTS 8,155,351 B2 * 4/2012 Hayashida ..................... 381/120
2006/0119485 A1 * 6/2006 Lee et al. ....................... 340/692

* cited by examiner

*Primary Examiner* — Vivian Chin
*Assistant Examiner* — Friedrich W Fahnert

(57) ABSTRACT

An approach is provided that receives a sound request from a requesting process. A selective mute setting is identified that corresponds to user enablement actions. If the selective mute setting is disabled the sound request is played at an audio output in response. However, if the selective mute setting being enabled, then steps are performed to determine whether to play the sound request. These steps include determining whether the sound request corresponds to one or more user sound request actions. If it is determined that the sound request corresponds to at least one of the user sound request actions then the sound request is audibly played at the audio output. However, if the sound request does not correspond to at least one of the user sound request actions, then the audio request is suppressed and not played at the audio output.

20 Claims, 6 Drawing Sheets

INTELLIGENT SELECTIVE SYSTEM MUTE

BACKGROUND OF THE INVENTION

1. Technical Field

The present invention relates to an approach that intelligently mutes audio output on an information handling system based upon user actions.

2. Description of the Related Art

With voice-over-Internet-protocol (VoIP), web videos, and other multimedia uses increasing, speakers, such as those on smaller systems like notebook computers, are utilized more often. However, unless the user remembers to mute their system after finishing their use of these applications, their system will continue to issue system sounds, possibly causing interruption or distraction. For example, when a user finishes a VoIP call and puts the system to sleep. Several hours later, they want to resume their system but are in a location where they would like the speakers to be muted, such as in a meeting. Because the user forgot to mute the speakers, the system might make unwanted sounds, such as beeps or intro music, that disrupts the meeting environment.

SUMMARY

An approach is provided that receives a sound request from a requesting process. A selective mute setting is identified that corresponds to user enablement actions. If the selective mute setting is disabled the sound request is played at an audio output in response. However, if the selective mute setting being enabled, then steps are performed to determine whether to play the sound request. These steps include determining whether the sound request corresponds to one or more user sound request actions. If it is determined that the sound request corresponds to at least one of the user sound request actions then the sound request is audibly played at the audio output. However, if the sound request does not correspond to at least one of the user sound request actions, then the audio request is suppressed and not played at the audio output.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings, wherein.

DETAILED DESCRIPTION

Certain specific details are set forth in the following description and figures to provide a thorough understanding of various embodiments of the invention. Certain well-known details often associated with computing and software technology are not set forth in the following disclosure, however, to avoid unnecessarily obscuring the various embodiments of the invention. Further, those of ordinary skill in the relevant art will understand that they can practice other embodiments of the invention without one or more of the details described below. Finally, while various methods are described with reference to steps and sequences in the following disclosure, the description as such is for providing a clear implementation of embodiments of the invention, and the steps and sequences of steps should not be taken as required to practice this invention. Instead, the following is intended to provide a detailed description of an example of the invention and should not be taken to be limiting of the invention itself. Rather, any number of variations may fall within the scope of the invention, which is defined by the claims that follow the description.

The following detailed description will generally follow the summary of the invention, as set forth above, further explaining and expanding the definitions of the various aspects and embodiments of the invention as necessary. To this end, this detailed description first sets forth a computing environment in FIG. 1 that is suitable to implement the software and/or hardware techniques associated with the invention. A networked environment is illustrated in FIG. 2 as an extension of the basic computing environment, to emphasize that modern computing techniques can be performed across multiple discrete devices.

Figure 1:
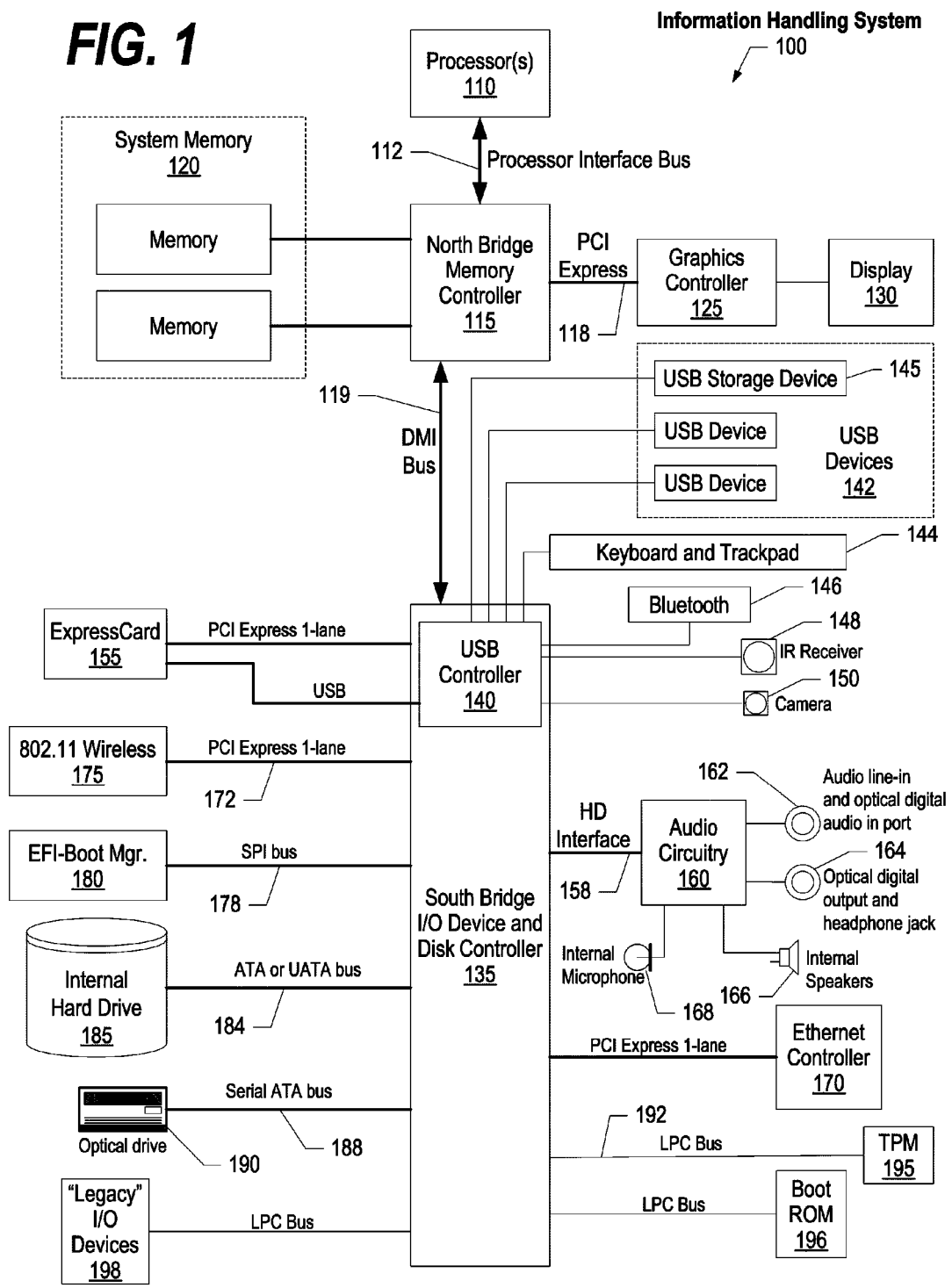
FIG. 1 is a block diagram of a data processing system in which the methods described herein can be implemented.
Figure 2:
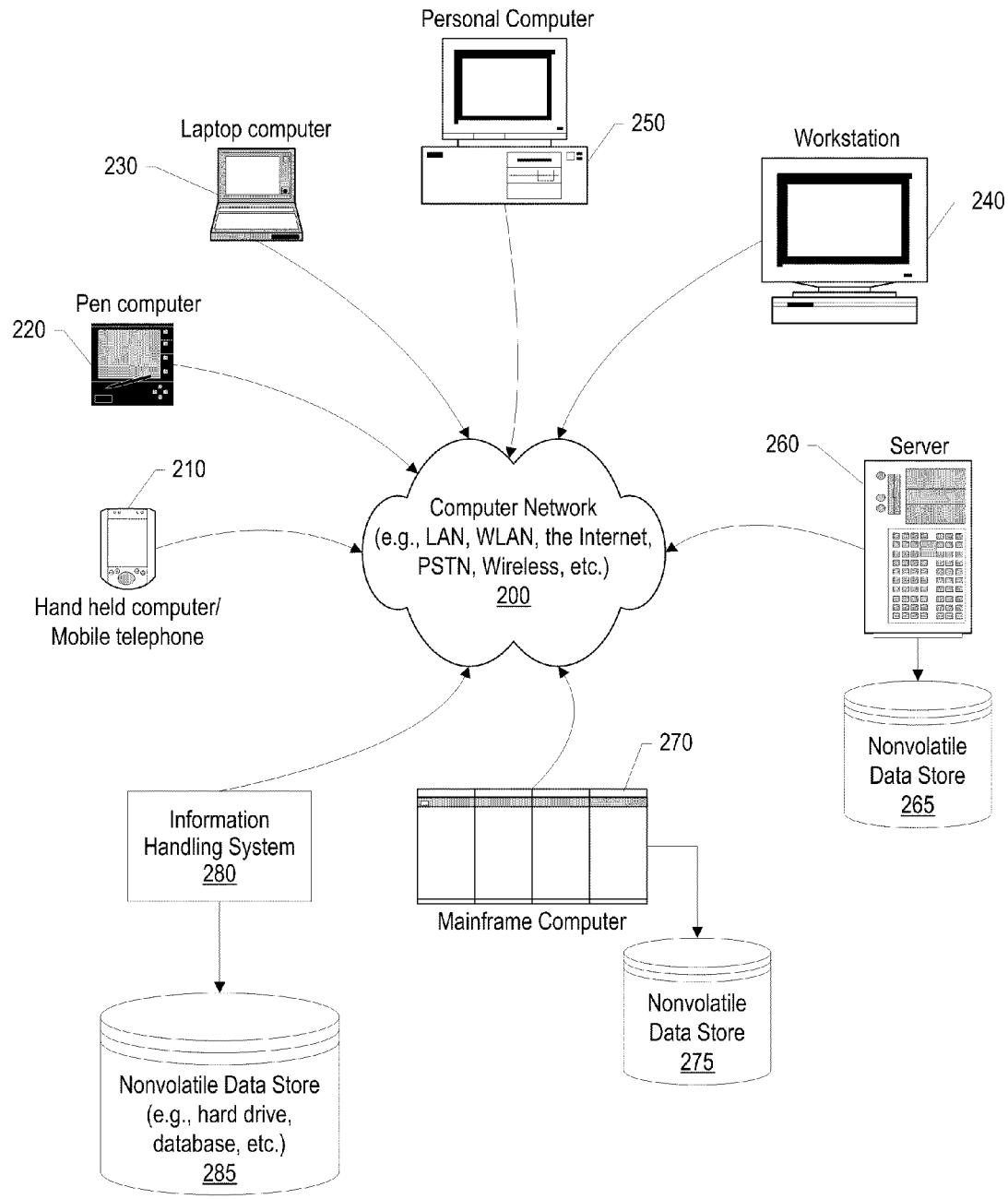
FIG. 2 provides an extension of the information handling system environment shown in FIG. 1 to illustrate that the methods described herein can be performed on a wide variety of information handling systems which operate in a networked environment.

FIG. 1 illustrates information handling system 100, which is a simplified example of a computer system capable of performing the computing operations described herein. Information handling system 100 includes one or more processors 110 coupled to processor interface bus 112. Processor interface bus 112 connects processors 110 to Northbridge 115, which is also known as the Memory Controller Hub (MCH). Northbridge 115 connects to system memory 120 and provides a means for processor(s) 110 to access the system memory. Graphics controller 125 also connects to Northbridge 115. In one embodiment, PCI Express bus 118 connects Northbridge 115 to graphics controller 125. Graphics controller 125 connects to display device 130, such as a computer monitor.

Northbridge 115 and Southbridge 135 connect to each other using bus 119. In one embodiment, the bus is a Direct Media Interface (DMI) bus that transfers data at high speeds in each direction between Northbridge 115 and Southbridge 135. In another embodiment, a Peripheral Component Interconnect (PCI) bus connects the Northbridge and the Southbridge. Southbridge 135, also known as the I/O Controller Hub (ICH) is a chip that generally implements capabilities that operate at slower speeds than the capabilities provided by the Northbridge. Southbridge 135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 196 and "legacy" I/O devices (using a "super I/O" chip). The "legacy" I/O devices (198) can include, for example, serial and parallel ports, keyboard, mouse, and/or a floppy disk controller. The LPC bus also connects Southbridge 135 to Trusted Platform Module (TPM) 195. Other components often included in Southbridge 135 include a Direct Memory Access (DMA) controller, a Programmable Interrupt Controller (PIC), and a storage device controller, which connects Southbridge 135 to nonvolatile storage device 185, such as a hard disk drive, using bus 184.

ExpressCard 155 is a slot that connects hot-pluggable devices to the information handling system. ExpressCard 155 supports both PCI Express and USB connectivity as it connects to Southbridge 135 using both the Universal Serial Bus (USB) the PCI Express bus. Southbridge 135 includes USB Controller 140 that provides USB connectivity to devices that connect to the USB. These devices include webcam (camera) 150, infrared (IR) receiver 148, keyboard and trackpad 144, and Bluetooth device 146, which provides for wireless personal area networks (PANs). An external device can wirelessly connect to Bluetooth device 146 and transmit data to the information handling system, in which case Bluetooth device 146 acts as a data receiver for the information handling system. USB Controller 140 also provides USB connectivity to other miscellaneous USB connected devices 142, such as a mouse, removable nonvolatile storage device 145, modems, network cards, ISDN connectors, fax, printers, USB hubs, and many other types of USB connected devices. While removable nonvolatile storage device 145 is shown as a USB-connected device, removable nonvolatile storage device 145 could be connected using a different interface, such as a Firewire interface, etcetera. When an external device is connected to USB controller 140 that is capable of receiving data from the information handling system, the USB controller acts as a data receiver.

Wireless Local Area Network (LAN) device 175 connects to Southbridge 135 via the PCI or PCI Express bus 172. LAN device 175 typically implements one of the IEEE 802.11 standards of over-the-air modulation techniques that all use the same protocol to wireless communicate between information handling system 100 and another computer system or device. Optical storage device 190 connects to Southbridge 135 using Serial ATA (SATA) bus 188. Serial ATA adapters and devices communicate over a high-speed serial link. The Serial ATA bus also connects Southbridge 135 to other forms of storage devices, such as hard disk drives. Audio circuitry 160, such as a sound card, connects to Southbridge 135 via bus 158. Audio circuitry 160 also provides functionality such as audio line-in and optical digital audio in port 162, optical digital output and headphone jack 164, internal speakers 166, and internal microphone 168. Ethernet controller 170 connects to Southbridge 135 using a bus, such as the PCI or PCI Express bus. Ethernet controller 170 connects information handling system 100 to a computer network, such as a Local Area Network (LAN), the Internet, and other public and private computer networks. When an external device connects to the information handling system using wireless LAN device 175 or wired LAN via a connection to Ethernet controller 170, and when the external device sends data to the information handling system, the LAN device 175 performs the role of a data receiver. Indeed, any device that can route or transmit data to the information handling system via a component of the information handling system acts as an external device and the component that receives such data acts as a data receiver of the information handling system.

While FIG. 1 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 195) shown in FIG. 1 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 2.

FIG. 2 provides an extension of the information handling system environment shown in FIG. 1 to illustrate that the methods described herein can be performed on a wide variety of information handling systems that operate in a networked environment. Types of information handling systems range from small handheld devices, such as handheld computer/mobile telephone 210 to large mainframe systems, such as mainframe computer 270. Examples of handheld computer 210 include personal digital assistants (PDAs), personal entertainment devices, such as MP3 players, portable televisions, and compact disc players. Other examples of information handling systems include pen, or tablet, computer 220, laptop, or notebook, computer 230, workstation 240, personal computer system 250, and server 260. Other types of information handling systems that are not individually shown in FIG. 2 are represented by information handling system 280. As shown, the various information handling systems can be networked together using computer network 200. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 2 depicts separate nonvolatile data stores (server 260 utilizes nonvolatile data store 265, mainframe computer 270 utilizes nonvolatile data store 275, and information handling system 280 utilizes nonvolatile data store 285). The nonvolatile data store can be a component that is external to the various information handling systems or can be internal to one of the information handling systems. In addition, removable nonvolatile storage device 145 can be shared among two or more information handling systems using various techniques, such as connecting the removable nonvolatile storage device 145 to a USB port or other connector of the information handling systems.

Figure 3:
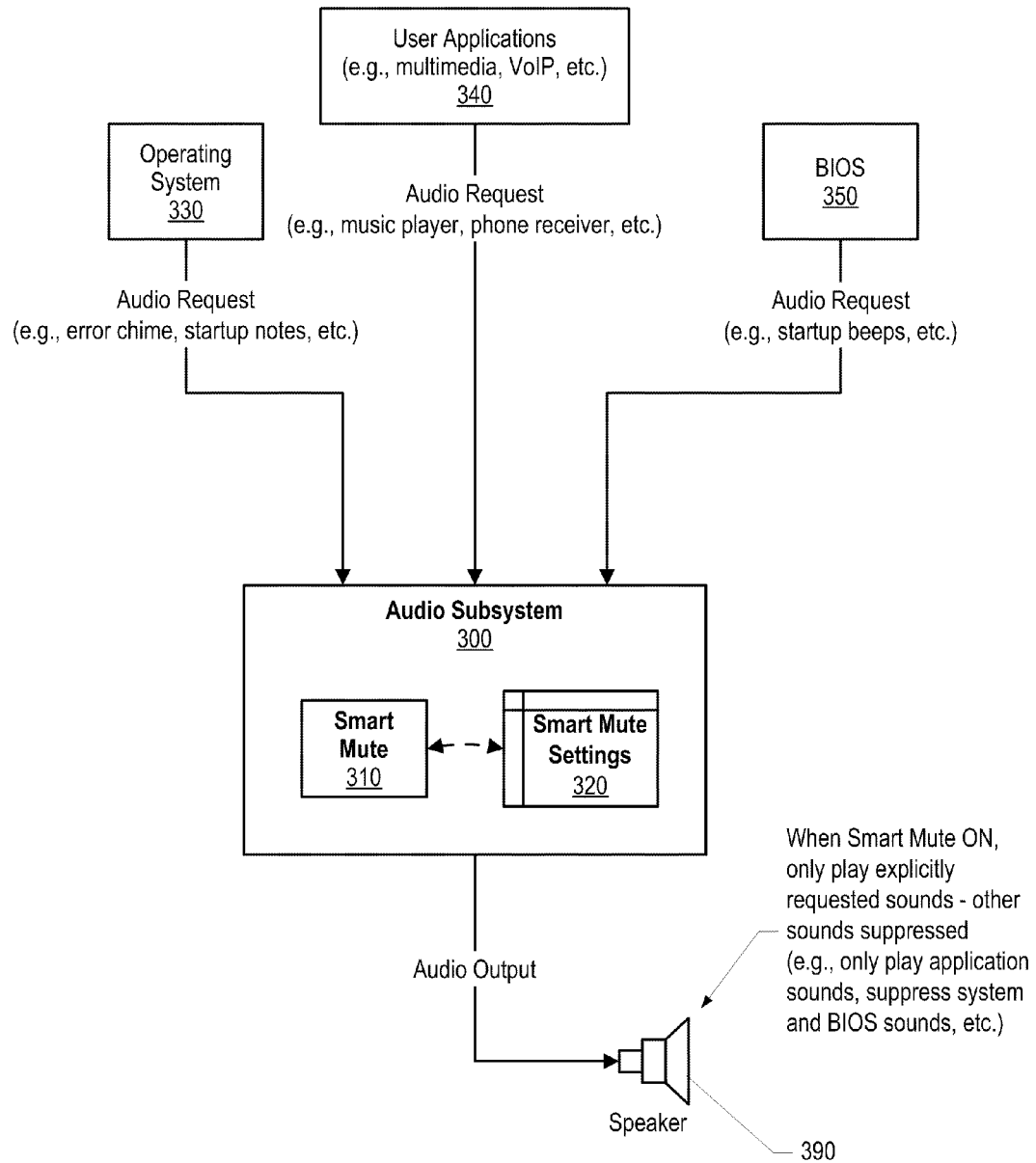
FIG. 3 is a diagram showing an audio subsystem selectively playing audio output based upon user actions.

FIG. 3 is a diagram showing an audio subsystem selectively playing audio output based upon user actions. Various software components (software applications) can make audio requests. These software applications include operating system processes 330, user software applications 340 (also referred to as application programs), and low-level operations, such as Basic Input Output System (BIOS) processes 350.

Audio subsystem 300 receives the various audio requests. Smart mute processing within the audio subsystem determines whether to audibly play the received audio requests based upon smart mute settings 320. If the smart mute process determines that the audio request should be played, then the request is played on audio output device 390, such as a speaker or headphone set.

Figure 4:
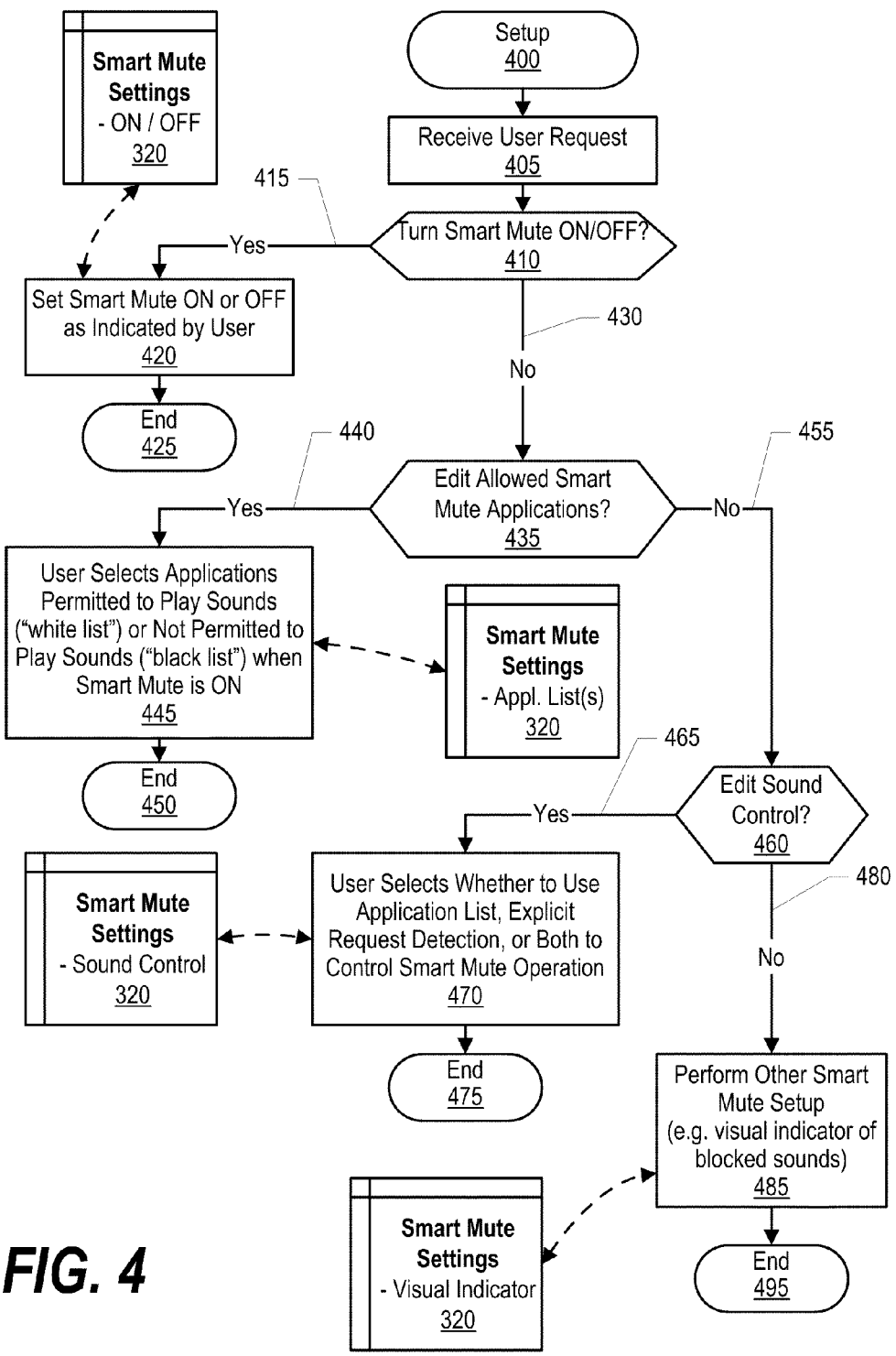
FIG. 4 is a flowchart showing steps taken to setup smart mute functionality that selectively plays audio output.

FIG. 4 is a flowchart showing steps taken to setup smart mute functionality that selectively plays audio output. Setting up the smart mute functionality can use default settings or can be configured by the user of the system. FIG. 4 shows how a user can configure the smart mute process. Processing commences at 400 whereupon, at step 405 a smart mute setup request is received by the smart mute process. A determination is made as to whether the user is requesting to enable or disable smart mute functionality (decision 410). If the user is enabling/disabling smart mute functionality, then decision 410 branches to "yes" branch 415 whereupon, at step 420, the smart mute functionality is either enabled or disabled (turned ON or OFF) as indicated by the user. In one embodiment, enabling and disabling smart mute functionality is performed using a visual toggle control that the user can select on the user's display screen. The enablement/disablement (ON/OFF) setting is stored in smart mute settings memory area 320. Smart mute settings memory area is used to store smart mute settings. This memory can be either volatile memory (e.g., RAM) or nonvolatile memory (e.g., NVRAM). If volatile memory is used, then processing can be periodically performed (e.g., during system shutdown, etc.) to retain the settings stored in volatile memory to a nonvolatile data store such as a hard disk file and to restore such settings by copying the settings from the nonvolatile data store to the volatile memory when the system is restarted (e.g., during system startup). Setup processing ends at 425.

Returning to decision 410, if the user request is not to enable/disable smart mute functionality, then decision 410 branches to "no" branch 430 whereupon a determination is made as to whether the user is requesting to edit a list of software applications that are allowed to play audio when smart mute is enabled (a "white list") or edit a list of software applications that are not allowed to play audio when smart mute is enabled (a "black list"). If the user is requesting to edit such selections, then decision 435 branches to "yes" branch 440 whereupon, at step 445, the user selects those applications that are allowed to play sounds when smart mute is enabled and these applications are stored in a "white list" in smart mute settings 320. The user can also select those applications that are not allowed to play sounds when smart mute is enabled and these applications are stored in a "black list" in smart mute settings memory area 320. Setup processing thereafter ends at 450. In one embodiment, only one list is allowed so the user can select either a white list or a black list but cannot request to use both types of lists.

Returning to decision 435, if the user is not requesting to edit list(s) of software applications that are allowed or not allowed to play audio when smart mute is enabled, then decision 435 branches to "no" branch 455 whereupon a determination is made as to whether the user wants to edit sound control options (decision 460). If the user is requesting to edit sound control options, then decision 460 branches to "yes" branch 465 whereupon, at step 470, the user selects how smart mute is to operate. The user can request that smart mute use white and/or black lists to determine which applications are allowed to play sounds when smart mute is enabled. The user can also request that smart mute use explicit request detection that detects when a user has requested that an application play a sound and allow such explicit requests (e.g., when the user presses "play" to play a DVD in a software DVD player or selects a media file, such as a song, in order to play the media file, etc.). In addition, the user can request to use both list functionality (white and/or black lists) as well as explicit request detection to determine whether an application is permitted to play sound when smart mute is enabled. These sound control selections are stored in smart mute settings memory area 320. Processing thereafter ends at 475.

Returning to decision 460, if the user is not requesting to edit sound control options, then decision 460 branches to "no" branch 480 whereupon other smart mute setup operations can be performed. One of these settings is whether the user wants to have a visual indicator, such as an icon that flashes, appear when a sound is muted by the smart mute process. This visual indicator can alert the user that a requested sound is being suppressed due to the smart mute settings allowing the user to adjust the settings if desired audio output is being suppressed. These other settings, including the visual indicator setting, are stored in smart mute settings memory area 320. Setup processing thereafter ends at 495.

Figure 5:
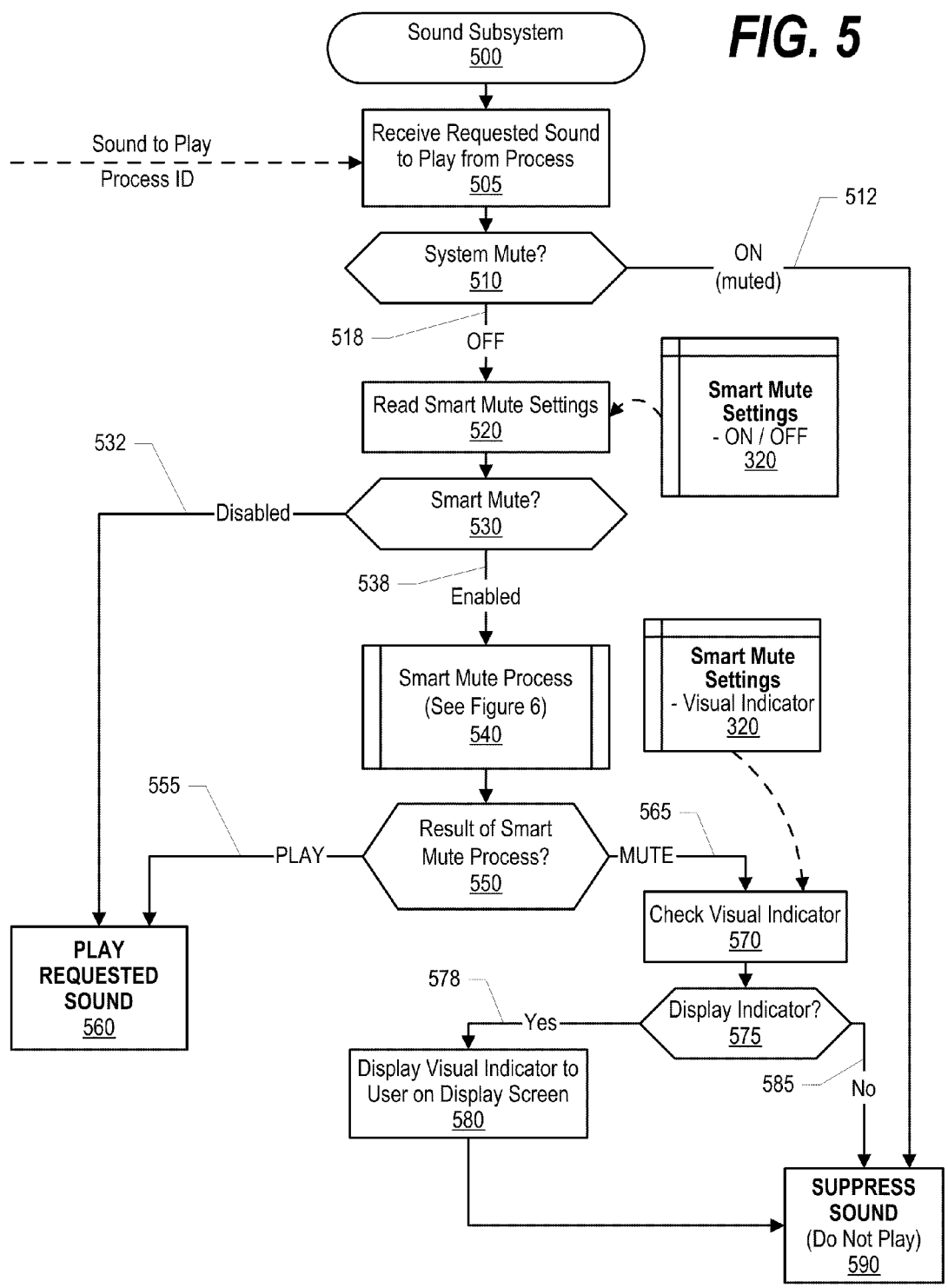
FIG. 5 is a flowchart showing steps taken by a sound subsystem in processing sound requests received from processes and selectively playing audio output based upon user actions.

FIG. 5 is a flowchart showing steps taken by a sound subsystem in processing sound requests received from processes and selectively playing audio output based upon user actions. Processing commences at 500 whereupon, at step 505, the sound subsystem receives a request from a requesting process to play a sound (e.g., a beep, music, etc.). The requesting process can be any process running in the system, such as an operating system process, a user application process, or a BIOS process.

A determination is made as to whether the overall system mute is on (decision 510). If the overall system mute is on, the sound subsystem will suppress (mute) all sounds from playing. If the overall system mute is on, decision 510 branches to ON branch 512 whereupon the requested sound is always suppressed at step 590. Returning to decision 510, if the overall system mute is not ON, then decision 510 branches to OFF branch 518 to begin smart mute processing.

At step 520, smart mute settings are read from smart mute settings memory area 320. Here, the smart mute enablement flag is disabled, then decision 530 branches to "disabled" branch 532 whereupon the requested sound is played at 560. However, if the smart mute is enabled, then decision 530 branches to "enabled" branch 538 whereupon smart mute processing is performed at predefined process 540 (see FIG. 6 and corresponding text for smart mute processing details). When predefined process 540 completes, a determination is made as to whether the result of the smart mute processing is to PLAY or MUTE the requested sound (decision 550). If the result is to play the requested sound, then decision 550 branches to PLAY branch 555 whereupon the requested sound is played at step 560. On the other hand, if the result of the smart mute processing is to mute the requested sound, then decision 550 branches to MUTE branch 565.

Following MUTE branch 565, at step 570 a check is made of the smart mute settings to check the smart mute visual indicator. A determination is made as to whether the settings are set to display a visual indicator when smart mute processing mutes a requested sound (decision 575). If a visual indicator has been requested, then decision 575 branches to "yes" branch 578 whereupon, at step 580, a visual indicator, such as a flashing icon, are displayed on the user's display screen alerting the user to the fact that a requested sound has been muted by the smart mute process. On the other hand, if the visual indicator has not been requested, then decision 575 branches to "no" branch 585 bypassing step 580. At step 590 the requested sound is suppressed (muted) and not played on the audio output, such as a speaker or headphone.

Figure 6:
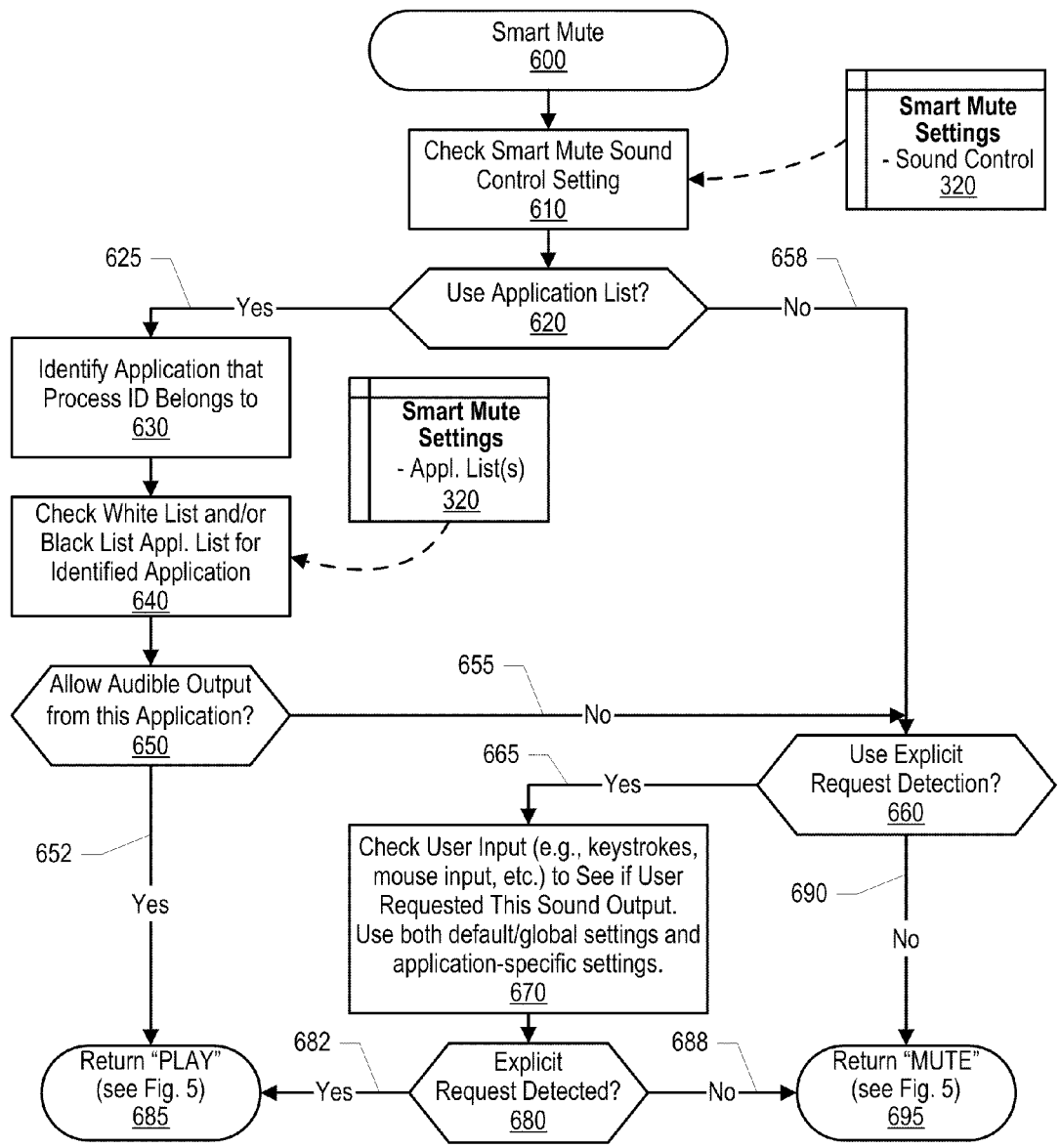
FIG. 6 is a flowchart showing steps taken by a smart mute component of the sound subsystem that determines whether to play or mute an audio request.

FIG. 6 is a flowchart showing steps taken by a smart mute component of the sound subsystem that determines whether to play or mute an audio request. Processing commences at 600 whereupon, at step 610, the smart mute process checks the smart mute sound control settings that determine whether an application list (white list and/or black list) should be used to determine which requested sounds should be played or whether explicit request detection should be used to identify requested sounds that correspond with a specific user request, such as a keyboard input or mouse input.

If the user has requested to use an application list(s) to control which applications can play audible output when smart mute is enabled, then decision 620 branches to "yes" branch 625 whereupon, at step 630, the smart mute process identifies the software application (e.g., the operating system, a user application program, etc.) to which the requesting process belongs. At step 640, this identified application is compared to white lists and/or black lists stored in smart mute settings memory area 320 (these lists are requested by the user during setup operations, see FIG. 4 for details). If a white list is being used, then the identified application needs to be on the white list in order for the smart mute process to allow the application to play audible output. Conversely, if a black list is being used, then if the identified application is on the black list, the smart mute process will not allow the application to play audible output. In one embodiment, only one list is allowed so the user can select either a white list or a black list but cannot request to use both types of lists. A determination is made as to whether, based on the application being included on a white or black list, to play the requested audio (decision 650). If white list processing is being used and the application is included on the white list, or if black list processing is being used and the application is not on the black list, then decision 650 branches to "yes" branch 652 whereupon processing returns to the calling routine (see FIG. 5) with an indication that the requested audio should PLAY the audio output at return 685. On the other hand, if white list processing is being used and the application is not included on the white list, or if black list processing is being used and the application is on the black list, then decision 650 branches to "no" branch 655.

Returning to decision 620, if an application list (white list or black list) is not being used, then decision 620 branches to "no" branch 658. In addition, if decision 650 branched to "no" branch 655, then when either "no" branch 658 or "no" branch 655 is taken then a determination is made as to whether the user has requested to use explicit request detection to determine which audio requests should be played (decision 660). If explicit request detection has been requested, then decision 660 branches to "yes" branch 665 whereupon, at step 670, the user's input is checked to identify if the user requested the requested audio. Both default, or global, settings can be used in addition to application-specific settings. In one embodiment, the system checks whether the requesting application has the user focus (e.g. is actively being used by the user). In a Microsoft Windows™ implementation, a technique such as using a GetForegroundWindow( ) API call can be used to identify the process that currently has the user focus. In another embodiment using particular operating environments, it might be possible to check an input stack, such as mouse events or keyboard events, to determine whether the user has performed a particular keyboard, mouse, or other input operation to request the sound that is being requested for playback. In a further embodiment, explicit request detection is performed by identifying whether a user input was received shortly before the audio request was received. An indication that an explicit request has not been received would be that user input is idle during a time period before the audio request was received. A determination is made as to whether an explicit user request is detected (decision 680). If an explicit user request is detected, then decision 680 branches to "yes" branch 682 whereupon processing returns to the calling routine (see FIG. 5) with an indication that the requested audio should PLAY the audio output at return 685. On the other hand, if an explicit user request is not detected, then decision 680 branches to "no" branch 688 whereupon processing returns to the calling routine (see FIG. 5) with an indication that the requested audio should MUTE the audio output at return 695. Finally, returning to decision 660, if explicit request detection has not been requested by the user during setup processing, then decision 660 branches to "no" branch 690 whereupon processing returns to the calling routine (see FIG. 5) with an indication that the requested audio should MUTE the audio output at return 695.

One of the implementations of the invention is a client application, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive). Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information that imparts functionality to a machine. Functional descriptive material includes, but is not limited to, computer programs, instructions, rules, facts, definitions of computable functions, objects, and data structures.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A machine-implemented method comprising:
   receiving a sound request from a requesting process;
   identifying a selective mute setting corresponding to one or more user enablement actions;
   determining whether the sound request corresponds to one or more user sound request actions;
   audibly playing the sound request at the audio output in response to determining that the sound request corresponds to at least one of the user sound request actions; and
   suppressing the sound request at the audio output in response to determining that the sound request fails to correspond with at least one of the user sound request actions.

2. The method of claim 1 further comprising:
   identifying a system mute setting prior to identifying the selective mute setting; and
   in response to the system mute setting being enabled, suppressing the sound request at the audio output.

3. The method of claim 1 wherein the determining whether the sound request corresponds to one or more user sound request actions further comprises:
   identifying a requesting application program that corresponds to the requesting process;
   comparing an identifier of the requesting application to one or more stored identifiers in a white list;
   audibly playing the sound request at the audio output in response to the comparison revealing that the requesting application identifier corresponds to at least one of the stored identifiers; and
   suppressing the requested sound in response to the comparison revealing that the requesting application identifier does not correspond to at least one of the stored identifiers.

4. The method of claim 1 wherein the determining whether the sound request corresponds to one or more user sound request actions further comprises:
   identifying a requesting application program that corresponds to the requesting process;
   comparing an identifier of the requesting application to one or more stored identifiers in a black list;
   audibly playing the sound request at the audio output in response to the comparison revealing that the requesting application identifier does not correspond to at least one of the stored identifiers; and
   suppressing the requested sound in response to the comparison revealing that the requesting application identifier corresponds to at least one of the stored identifiers.

5. The method of claim 1 wherein the determining whether the sound request corresponds to one or more user sound request actions further comprises:
   identify one or more user actions that occurred just prior to the receipt of the sound request;
   determining whether one of the user actions initiated the sound request by comparing the identified user actions with the requesting process;
   audibly playing the sound request at the audio output in response to determining that at least one of the user actions initiated the sound request; and
   suppressing the requested sound in response to determining that none of the user actions initiated the sound request.

6. The method of claim 5 wherein the determination of whether one of the user actions initiated the sound request further comprises:
   determining whether an application corresponding to the requesting process has user focus.

7. The method of claim 1 further comprising:
   displaying a visual indicator on a display device in response to suppressing the sound request at the audio output in response to determining that the sound request fails to correspond with at least one of the user sound request actions.

8. An information handling system comprising:
   one or more processors;
   a memory accessible by at least one of the processors;
   an audible output device that plays audible output, the audible output device accessible by at least one of the processors;
   a set of instructions stored in the memory and executed by at least one of the processors in order to perform actions of:
   receiving a sound request from a requesting process;
   identifying a selective mute setting corresponding to one or more user enablement actions;
   determining whether the sound request corresponds to one or more user sound request actions;
   audibly playing the sound request at the audio output in response to determining that the sound request corresponds to at least one of the user sound request actions; and
   suppressing the sound request at the audio output in response to determining that the sound request fails to correspond with at least one of the user sound request actions.

9. The information handling system of claim 8 wherein the set of instructions perform further actions comprising:
   identifying a system mute setting prior to identifying the selective mute setting; and
   in response to the system mute setting being enabled, suppressing the sound request at the audio output.

10. The information handling system of claim 8 wherein the action of determining whether the sound request corresponds to one or more user sound request actions further comprises actions of:
    identifying a requesting application program that corresponds to the requesting process;
    comparing an identifier of the requesting application to one or more stored identifiers in a white list;
    audibly playing the sound request at the audio output in response to the comparison revealing that the requesting application identifier corresponds to at least one of the stored identifiers; and
    suppressing the requested sound in response to the comparison revealing that the requesting application identifier does not correspond to at least one of the stored identifiers.

11. The information handling system of claim 8 wherein the action of determining whether the sound request corresponds to one or more user sound request actions further comprises actions of:
    identifying a requesting application program that corresponds to the requesting process;
    comparing an identifier of the requesting application to one or more stored identifiers in a black list;
    audibly playing the sound request at the audio output in response to the comparison revealing that the requesting application identifier does not correspond to at least one of the stored identifiers; and
    suppressing the requested sound in response to the comparison revealing that the requesting application identifier corresponds to at least one of the stored identifiers.

12. The information handling system of claim 8 wherein the action of determining whether the sound request corresponds to one or more user sound request actions further comprises actions of:
- identify one or more user actions that occurred just prior to the receipt of the sound request;
- determining whether one of the user actions initiated the sound request by comparing the identified user actions with the requesting process;
- audibly playing the sound request at the audio output in response to determining that at least one of the user actions initiated the sound request; and
- suppressing the requested sound in response to determining that none of the user actions initiated the sound request.

13. The information handling system of claim 12 wherein the determination of whether one of the user actions initiated the sound request further comprises actions of:
- determining whether an application corresponding to the requesting process has user focus.

14. A computer program product stored in a computer readable medium that is not a transitory propagating signal, comprising functional descriptive material that, when executed by an information handling system, causes the information handling system to perform actions comprising:
- receiving a sound request from a requesting process;
- identifying a selective mute setting corresponding to one or more user enablement actions;
- determining whether the sound request corresponds to one or more user sound request actions;
- audibly playing the sound request at the audio output in response to determining that the sound request corresponds to at least one of the user sound request actions; and
- suppressing the sound request at the audio output in response to determining that the sound request fails to correspond with at least one of the user sound request actions.

15. The computer program product of claim 14 wherein the actions further comprise:
- identifying a system mute setting prior to identifying the selective mute setting; and
- in response to the system mute setting being enabled, suppressing the sound request at the audio output.

16. The computer program product of claim 14 wherein the action of determining whether the sound request corresponds to one or more user sound request actions further comprises actions of:
- identifying a requesting application program that corresponds to the requesting process;
- comparing an identifier of the requesting application to one or more stored identifiers in a white list;
- audibly playing the sound request at the audio output in response to the comparison revealing that the requesting application identifier corresponds to at least one of the stored identifiers; and
- suppressing the requested sound in response to the comparison revealing that the requesting application identifier does not correspond to at least one of the stored identifiers.

17. The computer program product of claim 14 wherein the action of determining whether the sound request corresponds to one or more user sound request actions further comprises actions of:
- identifying a requesting application program that corresponds to the requesting process;
- comparing an identifier of the requesting application to one or more stored identifiers in a black list;
- audibly playing the sound request at the audio output in response to the comparison revealing that the requesting application identifier does not correspond to at least one of the stored identifiers; and
- suppressing the requested sound in response to the comparison revealing that the requesting application identifier corresponds to at least one of the stored identifiers.

18. The computer program product of claim 14 wherein the determining whether the sound request corresponds to one or more user sound request actions further comprises actions of:
- identify one or more user actions that occurred just prior to the receipt of the sound request;
- determining whether one of the user actions initiated the sound request by comparing the identified user actions with the requesting process;
- audibly playing the sound request at the audio output in response to determining that at least one of the user actions initiated the sound request; and
- suppressing the requested sound in response to determining that none of the user actions initiated the sound request.

19. The computer program product of claim 18 wherein the determination of whether one of the user actions initiated the sound request further comprises actions of:
- determining whether an application corresponding to the requesting process has user focus.

20. The computer program product of claim 14 wherein the actions further comprise:
- displaying a visual indicator on a display device in response to suppressing the sound request at the audio output in response to determining that the sound request fails to correspond with at least one of the user sound request actions.

* * * * *